(12) United States Patent
Majumdar et al.

(10) Patent No.: US 7,648,868 B2
(45) Date of Patent: Jan. 19, 2010

(54) METAL-GATED MOSFET DEVICES HAVING SCALED GATE STACK THICKNESS

(75) Inventors: Amlan Majumdar, White Plains, NY (US); Renee Tong Mo, Briarcliff Manor, NY (US); Zhibin Ren, Hopewell Junction, NY (US); Jeffrey Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 11/931,033

(22) Filed: Oct. 31, 2007

(65) Prior Publication Data

US 2009/0108352 A1 Apr. 30, 2009

(51) Int. Cl.
- *H01L 21/336* (2006.01)
- *H01L 21/8234* (2006.01)
- *H01L 21/8238* (2006.01)

(52) U.S. Cl. ...................... 438/198; 438/230
(58) Field of Classification Search ................ 438/198, 438/230; 257/E21.32
See application file for complete search history.

(56) References Cited

U.S. PATENT DOCUMENTS

| 4,900,591 | A | 2/1990 | Bennett et al. |
| 5,397,720 | A | 3/1995 | Kwong et al. |
| 6,060,749 | A | 5/2000 | Wu |
| 6,551,898 | B1 * | 4/2003 | Hughes et al. .............. 438/407 |
| 6,709,913 | B2 | 3/2004 | Hsu |
| 7,227,228 | B2 | 6/2007 | Kohyama |
| 7,227,230 | B2 | 6/2007 | Gambino et al. |
| 2001/0031562 | A1 | 10/2001 | Raaijmakers et al. |
| 2003/0060057 | A1 | 3/2003 | Raaijmakers et al. |
| 2003/0234417 | A1 | 12/2003 | Raaijmakers et al. |
| 2004/0063298 | A1 | 4/2004 | Aga et al. |
| 2005/0042840 | A1 | 2/2005 | Aga et al. |
| 2005/0064632 | A1 | 3/2005 | Sakurada et al. |
| 2006/0040484 | A1 * | 2/2006 | Dokumaci et al. .......... 438/595 |
| 2006/0151846 | A1 * | 7/2006 | Callegari et al. ............ 257/411 |
| 2006/0170050 | A1 | 8/2006 | Forbes |
| 2006/0175659 | A1 | 8/2006 | Sleight |
| 2006/0255405 | A1 | 11/2006 | Tsui et al. |
| 2007/0023831 | A1 | 2/2007 | Kitagawa et al. |
| 2007/0045742 | A1 | 3/2007 | Wang et al. |
| 2007/0111448 | A1 | 5/2007 | Li et al. |
| 2007/0122634 | A1 | 5/2007 | Lee et al. |
| 2007/0128736 | A1 | 6/2007 | Chang et al. |
| 2007/0128820 | A1 | 6/2007 | Majumdar et al. |
| 2007/0128838 | A1 | 6/2007 | Aoki |
| 2007/0290265 | A1 * | 12/2007 | Augusto et al. ............. 257/351 |

\* cited by examiner

*Primary Examiner*—William M. Brewster
(74) *Attorney, Agent, or Firm*—Vazken Alexanian; Michael J. Chang, LLC

(57) ABSTRACT

Metal-oxide semiconductor field effect transistor (MOSFET) devices having metal gate stacks and techniques for improving performance thereof are provided. In one aspect, a metal-oxide semiconductor device is provided comprising a substrate having a buried oxide layer at least a portion of which is configured to serve as a primary background oxygen getterer of the device; and a gate stack separated from the substrate by an interfacial oxide layer. The gate stack comprises a high-K layer over the interfacial oxide layer; and a metal gate layer over the high-K layer.

20 Claims, 16 Drawing Sheets

100

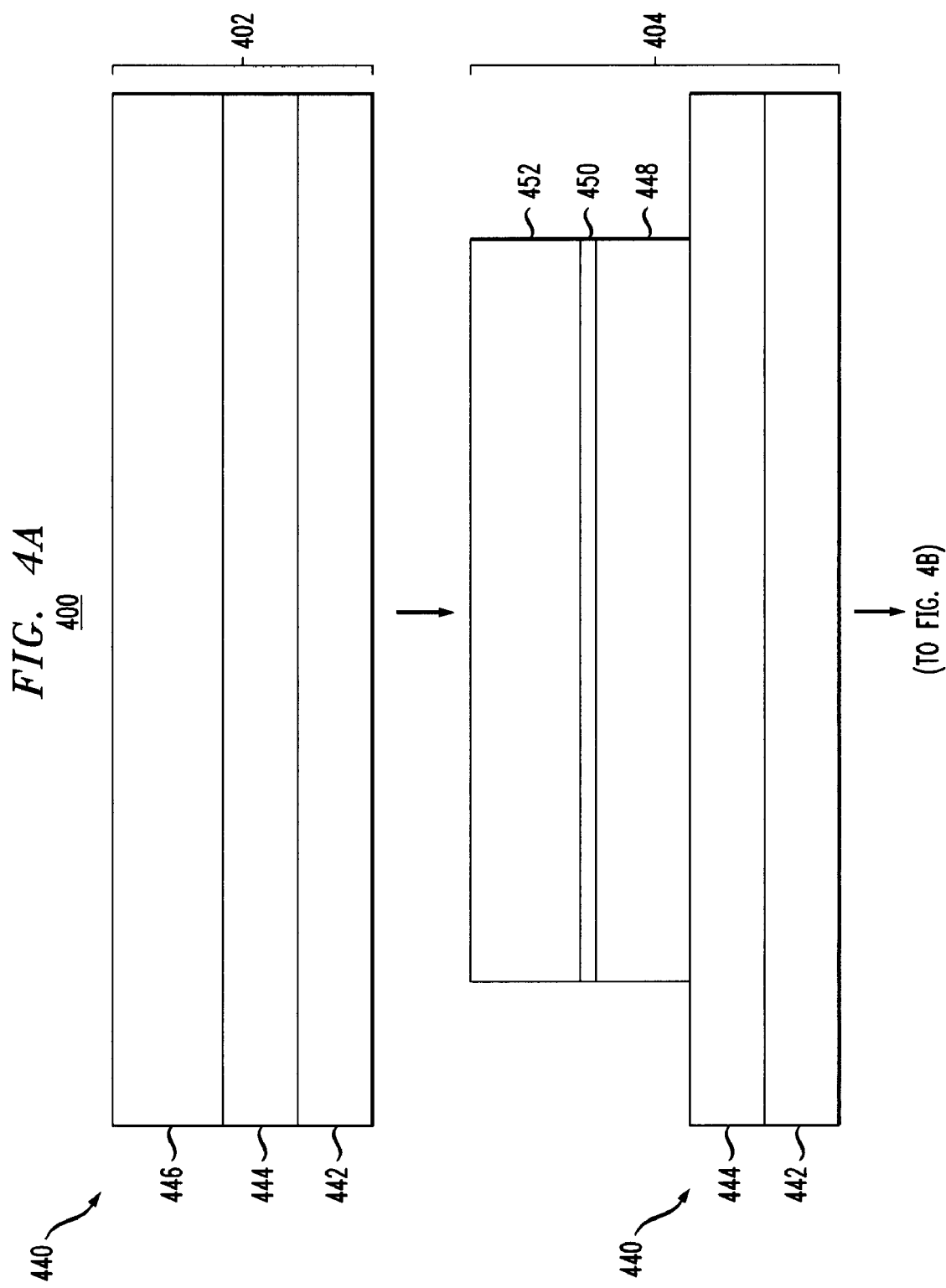

(FROM FIG. 4A) (TO FIG. 4C)

(FROM FIG. 4C)
(TO FIG. 4E)

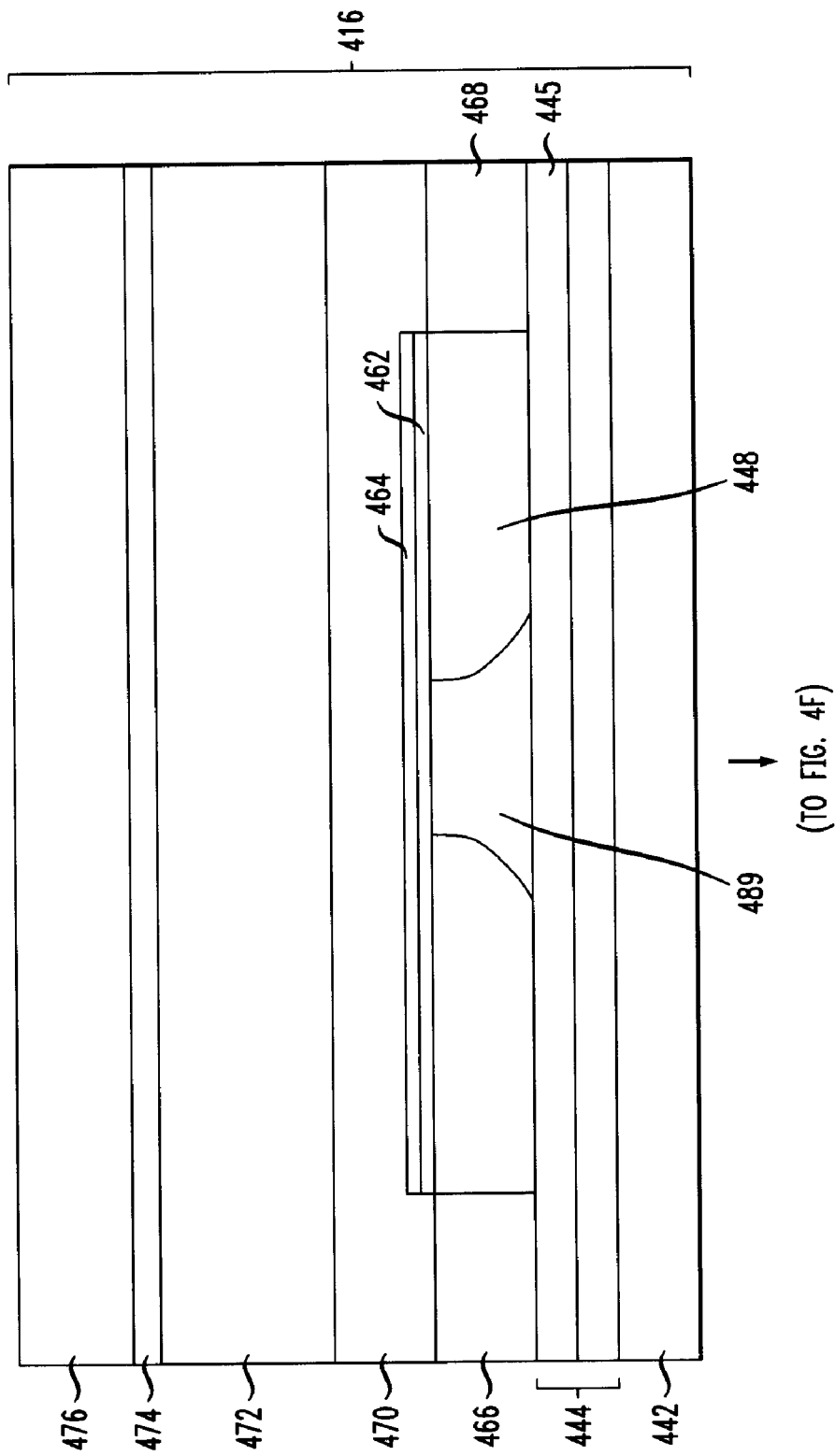

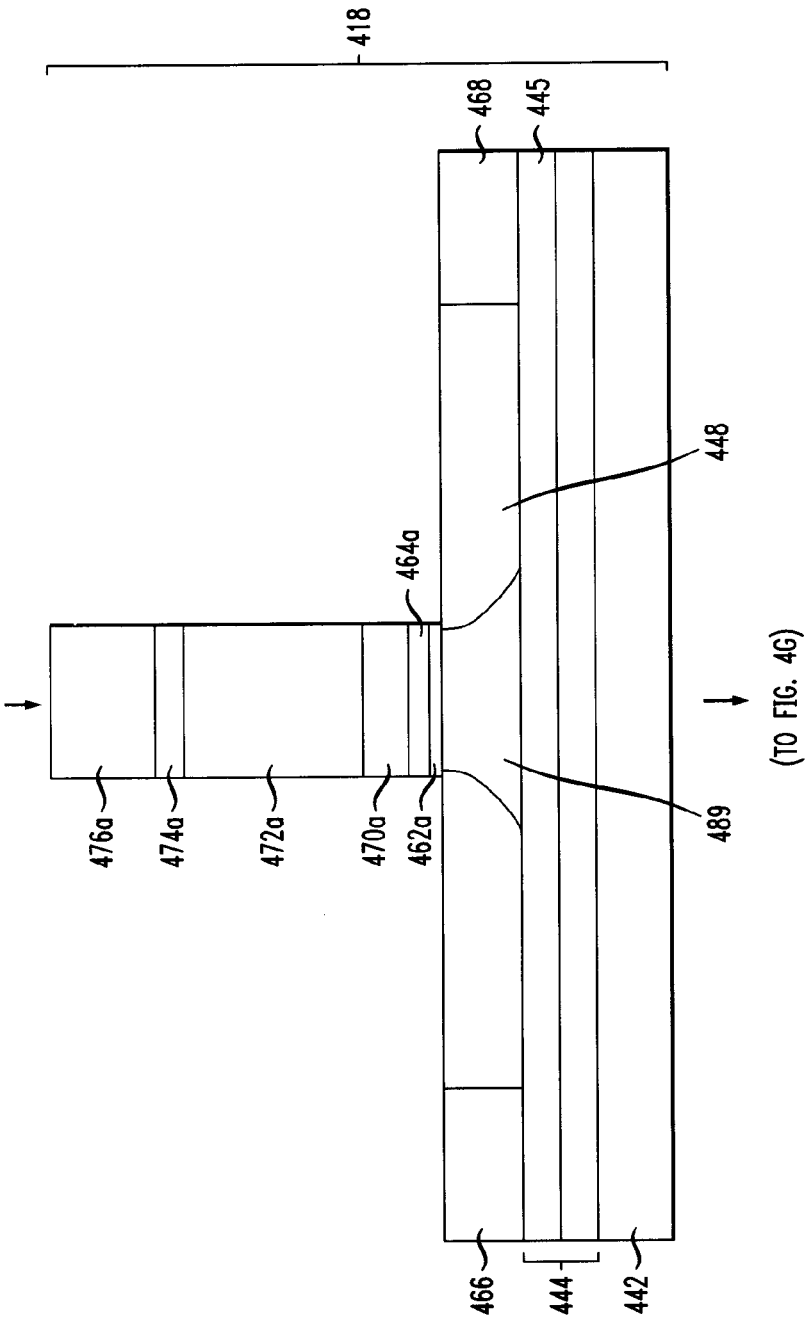

(FROM FIG. 4F)
(TO FIG. 4H)

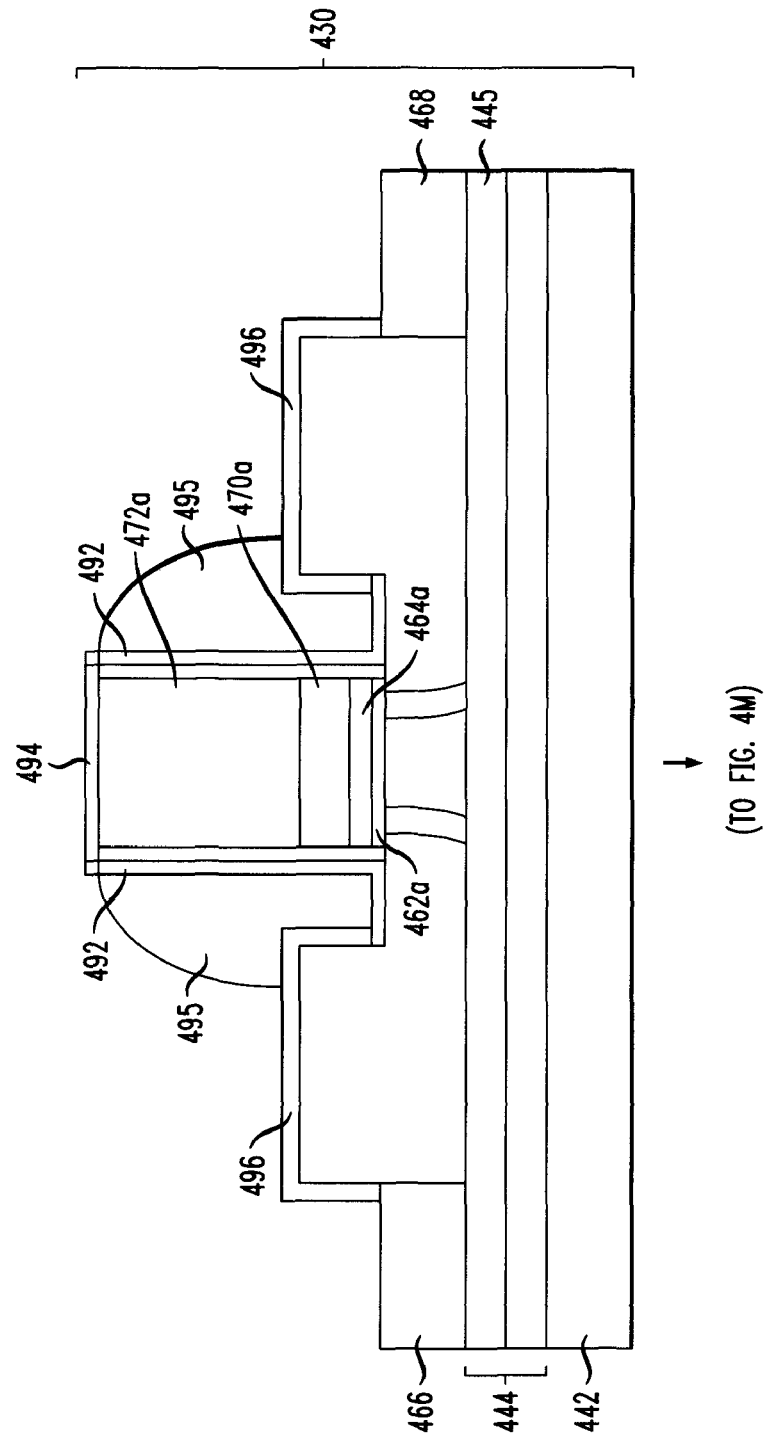

(FROM FIG. 4L)

METAL-GATED MOSFET DEVICES HAVING SCALED GATE STACK THICKNESS

FIELD OF THE INVENTION

The present invention relates to metal-oxide semiconductor field effect transistor (MOSFET) devices, and more particularly, to metal-gated MOSFET devices and techniques for scaling metal gate stack thickness so as to improve device performance.

BACKGROUND OF THE INVENTION

Metal-oxide semiconductor field effect transistor (MOSFET) devices are used in many integrated circuit designs, serving as switches to open and close the circuits. In general, a MOSFET device comprises a source region and a drain region connected by a channel, and a gate stack separated from the channel by a gate dielectric. The channel can comprise an n-type or p-type semiconductor material, forming an n-channel MOSFET (NMOSFET) or a p-channel MOSFET (PMOSFET) device, respectively.

Traditionally, the gate stack in a MOSFET device would comprise a semiconductor material, such as silicon, over a nitride-containing layer, which serves as the gate dielectric. Current research, however, is focused on the development of metal-gated MOSFET devices, e.g., MOSFET devices wherein the gate stack comprises a metal gate layer over a high-K layer, which serves as the gate dielectric. The use of metal-gated MOSFET devices is favorable for complementary metal-oxide semiconductor (CMOS) technology scaling. As such, with the current need for transistors having smaller feature sizes, improved metal-gated MOSFET devices are in demand.

To implement a metal gate stack in a MOSFET device, an interfacial oxide region is typically incorporated between the gate stack and the channel. However, regrowth of the interfacial oxide region, e.g., during fabrication of the device, can negatively affect device performance, as it increases the effective oxide thickness (EOT) and degrades the short channel and scaling benefits of the metal gate.

Typically, with metal-gated MOSFET devices, regrowth of the interfacial oxide region is prevented by amorphous silicon (Si) or poly-silicon (poly-Si) present in the gate stack over the metal gate layer which serves to attract background oxygen, and thereby prevents regrowth of the interfacial oxide region. However, to be effective at preventing regrowth the amorphous Si or poly-Si has to be located in close proximity to the interfacial oxide region. Since the metal gate layer is present in the gate stack between the amorphous Si/poly-Si and the interfacial oxide region, the thickness of the metal gate layer is limited, typically to about 10 nanometers. Having a thicker metal gate layer places the interfacial oxide region too far away from the amorphous Si/poly-Si and thus leads to regrowth of the interfacial oxide region. Having this thickness limitation is disadvantageous because increasing the thickness of the metal gate layer can enhance device performance.

Therefore, techniques that permit the metal gate layer thickness to be increased, and thus enhancing device performance, without causing regrowth at the interfacial oxide region would be desirable.

SUMMARY OF THE INVENTION

The present invention provides metal-oxide semiconductor field effect transistor (MOSFET) devices having metal gate stacks and techniques for improving performance thereof. In one aspect of the invention, a metal-oxide semiconductor device is provided comprising a substrate having a buried oxide layer at least a portion of which is configured to serve as a primary background oxygen getterer of the device; and a gate stack separated from the substrate by an interfacial oxide layer. The gate stack comprises a high-K layer over the interfacial oxide layer; and a metal gate layer over the high-K layer.

In another aspect of the invention, a method for fabricating a metal-oxide semiconductor device is provided. The method comprises the following steps. A wafer is provided having a buried oxide layer between a first semiconductor layer and a second semiconductor layer. One or more oxygen getterer species are implanted into at least a portion of the buried oxide layer. A well region is formed in the first semiconductor layer. An interfacial oxide layer is formed over the well region. A gate stack is formed over the interfacial oxide layer. A first raised source/drain region and a second raised source/drain region are formed adjacent to opposite sides of the gate stack. A first source/drain extension region is formed that extends the first raised source/drain region to the well region and a second source/drain extension region is formed that extends the second raised source/drain region to the well region.

A more complete understanding of the present invention, as well as further features and advantages of the present invention, will be obtained by reference to the following detailed description and drawings.

BRIEF DESCRIPTION OF THE DRAWINGS

FIGS. 4A-M are cross-sectional diagrams illustrating an exemplary methodology for fabricating a MOSFET device according to an embodiment of the present invention.

DETAILED DESCRIPTION OF PREFERRED EMBODIMENTS

Figure 1:
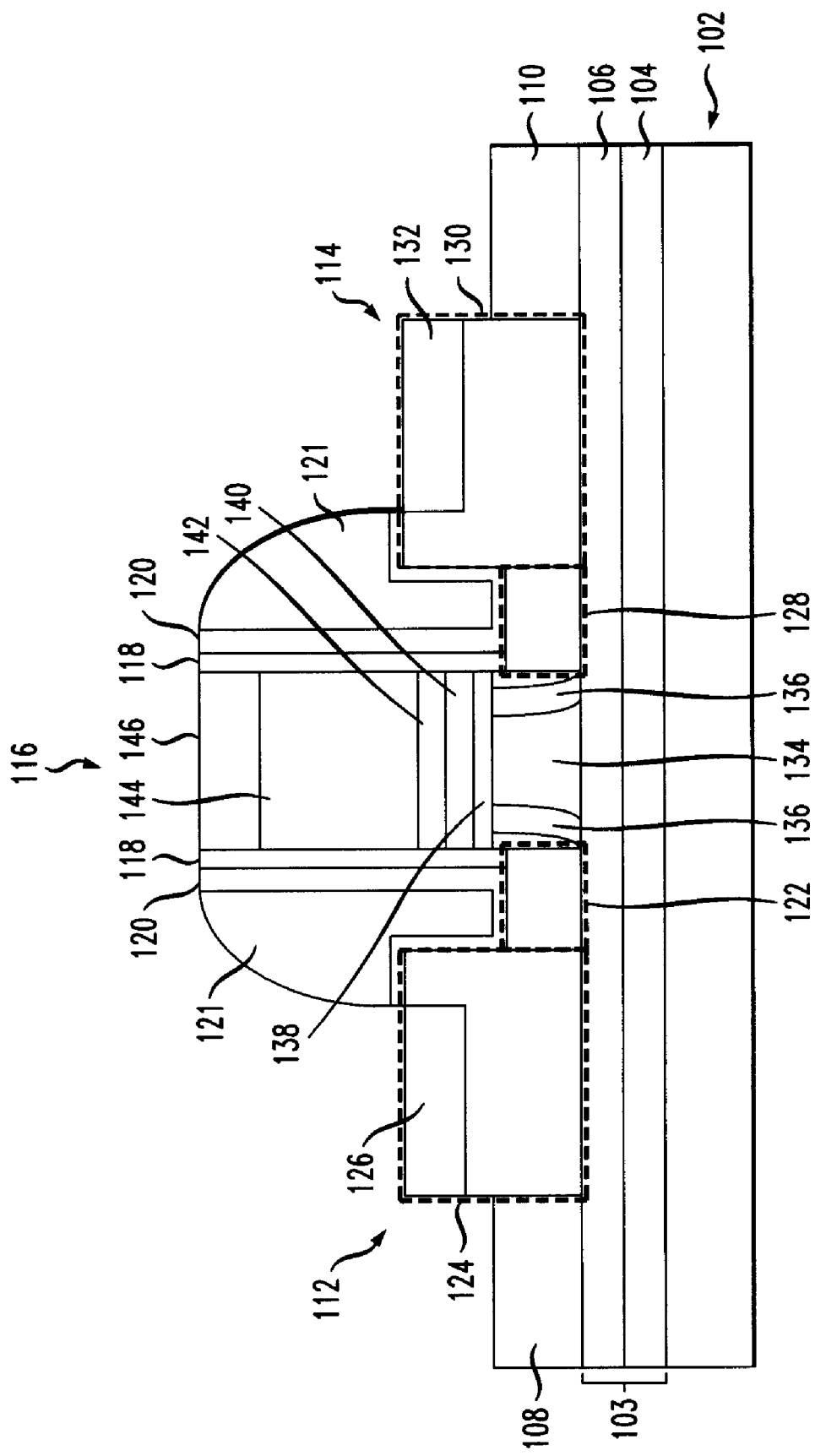
FIG. 1 is a cross-sectional diagram illustrating an exemplary metal-oxide semiconductor field effect transistor (MOSFET) device according to an embodiment of the present invention.

FIG. 1 is a cross-sectional diagram illustrating exemplary metal-oxide semiconductor field effect transistor (MOSFET) device 100. According to an exemplary embodiment, MOSFET device 100 is either an n-channel MOSFET (NMOSFET) (abbreviated hereinafter as "NFET") device or a p-channel MOSFET (PMOSFET) (abbreviated hereinafter as "PFET") device. MOSFET device 100 comprises substrate 102 having shallow trench isolation (STI) regions 108/110 and source/drain regions 112/114 formed therein, gate stack 116 separated from substrate 102 by interfacial oxide layer 138 and nitride spacers 118/offset spacers 120/source/drain diffusion spacers 121 adjacent to gate stack 116.

Substrate 102 comprises a silicon-on-insulator (SOI) substrate. As will be described in detail below, substrate 102 is formed from a thin SOI wafer, such as an ultra-thin SOI (UTSOI) wafer or an extra-thin SOI (ETSOI) wafer having a buried oxide (BOX) layer present between two semiconductor layers. According to an exemplary embodiment, each of the semiconductor layers comprises silicon (Si). In general, UTSOI wafers comprise a silicon layer over an insulator (e.g., a BOX layer), wherein the silicon layer (also referred to herein as a "device layer") has a thickness of between about 13 nanometers (nm) and about 20 nm, and ETSOI wafers comprise a silicon layer over an insulator (e.g., a BOX layer), wherein the silicon layer (also referred to herein as a "device layer") has a thickness of between about seven nm and about 10 nm.

The BOX layer forms BOX layer 103 in substrate 102. According to the present teachings, at least a portion of BOX layer 103 is configured to act as a primary background oxygen getterer of the device, i.e., to attract any background oxygen present. Namely, at least a portion of BOX layer 103 is configured to be Si-rich and/or is implanted with an oxygen getterer species, such as one or more of arsenic (As) and boron (B). According to the exemplary embodiment shown in FIG. 1, BOX layer 103 is configured, in its entirety, to be Si-rich, with an oxygen getterer species implanted into region 106. Variations on this embodiment are, however, possible. For example, BOX layer 103 can, in its entirety, be either configured to be Si-rich or implanted with an oxygen getterer species.

As the primary background oxygen getterer, BOX layer 103 serves to prevent regrowth of interfacial oxide layer 138 that separates gate stack 116 from substrate 102. The regrowth of the interfacial oxide layer and its effect on device performance will be described in detail below. The term "primary background oxygen getterer," as used herein, refers to the ability of, i.e., BOX layer 103, to serve as the main, and in some instances the only background oxygen getterer of the device. As such, other background oxygen getterer(s) may, or may not be, present in the device. For example, in some embodiments herein, a silicon layer is present in the gate stack and can serve, at least to some extent, as a background oxygen getterer.

Source/drain region 112 comprises a source/drain extension region 122 that is continuous with a raised source/drain region 124 (having silicide region 126 formed on a top surface thereof). Each of source/drain extension region 122 and raised source/drain region 124 are doped. Suitable dopants will vary depending on whether MOSFET device 100 is an NFET or a PFET device. By way of example only, when MOSFET device 100 is an NFET device, suitable dopants for each of source/drain extension region 122 and raised source/drain region 124 include, but are not limited to, one or more of As, phosphorous (P) and antimony (Sb). When MOSFET device 100 is a PFET device, suitable dopants for each of source/drain extension region 122 and raised source/drain region 124 include, but are not limited to, one or more of B and borondifluoride ($BF_2$). Source/drain region 114 comprises a source/drain extension region 128 that is continuous with a raised source/drain region 130 (having silicide region 132 formed on a top surface thereof). As above, when MOSFET device 100 is an NFET device, suitable dopants for each of source/drain extension region 128 and raised source/drain region 130 include, but are not limited to, one or more of As, P and Sb. When MOSFET device 100 is a PFET device, suitable dopants for each of source/drain extension region 128 and raised source/drain region 130 include, but are not limited to, one or more of B and $BF_2$.

Well region 134 is present between source/drain region 112 and source/drain region 114. Well region 134 serves as a channel of the device. According to an exemplary embodiment, MOSFET device 100 is either an NFET or a PFET device and well region 134 comprises either a p-well implant (such as one or more of B, $BF_2$ and indium (In)) or an n-well implant (such as one or more of As, P and Sb), respectively. A halo region 136 is present on either side of well region 134. In general, halo regions are present in most complementary metal-oxide semiconductor (CMOS) devices at 0.25 micrometers (μm) and under, as the halo regions provide an increase in effective channel doping as the channel length is decreased (i.e., halo regions help in suppressing short channel effects). When MOSFET device 100 is an NFET device, halo regions 136 can comprise one or more of B and $BF_2$. When MOSFET device 100 is a PFET device, halo regions 136 can comprise one or more of As, P and Sb.

Gate stack 116 comprises high-K layer 140, metal gate layer 142 over high-K layer 140 and silicon layer 144 over a side of metal gate layer 142 opposite high-K layer 140. High-K layer 140 can comprise one or more of hafnium oxide ($HfO_2$), tantalum oxide ($Ta_2O_5$), titanium oxide ($TiO_2$), aluminum oxide ($Al_2O_3$) and lanthanum oxide ($La_2O_5$). Metal gate layer 142 can comprise one or more of tantalum (Ta), tantalum nitride (TaN), tantalum carbide nitride (TaCN), tantalum silicon nitride (TaSiN), tantalum silicide (TaSi), aluminum nitride (AlN), tungsten (W) and molybdenum (Mo). Silicon layer 144 can comprise one or more of amorphous Si or poly-silicon (poly-Si). Silicon layer 144 can be doped. When MOSFET device 100 comprises an NFET device, silicon layer 144 can be doped with one or more of As, P and Sb. When MOSFET device 100 comprises a PFET device, silicon layer 144 can be doped with one or more of B and $BF_2$. Silicon layer 144 has silicide region 146 formed thereon.

According to an exemplary embodiment, metal gate layer 142 has a thickness of about 10 nm, and silicon layer 144 has a thickness of between about 40 nm and about 90 nm. The thickness of the metal gate layer can be varied, for example, to enhance performance of the device. See, for example, FIGS. 2 and 3 (described below).

As highlighted above, interfacial oxide layer 138 separates gate stack 116 from substrate 102. According to an exemplary embodiment, interfacial oxide layer 138 comprises silicon dioxide ($SiO_2$). During fabrication of MOSFET device 100, as will be described in detail below, the interfacial oxide layer is grown over the substrate during the formation of the gate stack. Later in the fabrication process, however, if background oxygen from adjacent spacers and other CMOS processes reaches the interfacial oxide layer, e.g., during high temperature sequences (such as during the final activation anneal), regrowth of the interfacial oxide layer can occur. Regrowth of the interfacial oxide layer is unfavorable as it increases the effective oxide thickness (EOT) and degrades the short channel and scaling benefits of using a metal gate stack.

One technique that has been used in some devices to prevent regrowth of the interfacial oxide layer is to encapsulate the device in a diffusion barrier. For example, a nitride can be used as a diffusion barrier in the device. The effectiveness of this technique is dependent upon the nitride characteristics. Also, a nitride will contribute to an elevated out fringe capacitance in metal-gated devices. Even with a nitride barrier, the diffusion barrier is not strong enough to enable increasing the metal thickness (which, as described below, can enhance device performance) without regrowth of the interfacial oxide layer occurring.

The present techniques solve this problem by using the BOX layer as the primary background oxygen getterer of the device. According to the present teachings, the BOX layer is located closer to the interfacial oxide layer than in conventional devices. Namely, as described above, the present MOSFET device comprises an UTSOI or ETSOI substrate. With either substrate configuration (UTSOI or ETSOI) the BOX layer is closer to the gate stack. Namely, in conventional devices utilizing SOI substrates, the silicon layer over the insulator, i.e., the device layer, has a thickness of about 70 nm. By comparison, as described above, with an UTSOI or ETSOI the silicon layer over the insulator, i.e., the device layer, is at most about 20 nm thick. As such, in the present teachings, the thickness of the silicon layer separating the BOX layer from the gate stack is less than in conventional devices. Further, since the BOX layer is present below the interfacial oxide layer, the thickness of the metal gate layer does not affect the distance between the BOX layer and the interfacial oxide layer, and thus will not impact the effectiveness of the BOX layer in preventing regrowth of the interfacial oxide layer.

Advantageously, it has been discovered by way of the present techniques that increasing the thickness of the metal gate layer can enhance performance of the device. For example, the metal gate layer can be grown as a stressed film, thereby imparting favorable stress on the device and improving device performance (e.g., both direct current (DC) performance through stressed metals and alternating current (AC) performance due to a superior resistive capacitive (RC) delay in metal, i.e., versus conventional silicide/doped poly-Si gate lines). Additionally, it may be possible to relax the sidewall diffusion barrier nitride requirement, i.e., it may be possible to scale down the thickness of the nitride diffusion barrier (see above) and/or to eliminate the nitride diffusion barrier altogether, and thereby improve the outer fringe parasitic capacitance (Cof). Growing the metal gate layer as a stressed film produces a metal gate layer with a thickness that is greater than what can generally be supported by conventional device designs (see description above). However, since the present techniques do not have these restraints on the metal gate layer thickness, the metal gate layer can be grown as a stressed film.

As shown in FIG. 1, nitride spacers 118 are present adjacent to gate stack 116 and offset spacers 120 are present between nitride spacers 118 and source/drain diffusion spacers 121. According to an exemplary embodiment, offset spacers 120 comprise oxide spacers and source/drain diffusion spacers 121 comprise nitride spacers. Nitride spacers 118 and offset spacers 120 are configured to have a combined thickness to set proper overlap capacitance for rapid thermal annealing (RTA)-source/drain extension flow. Namely, as will be described in detail below, source/drain extension implants will be made after nitride spacers 118 and offset spacers 120 are present. Therefore, the implanted profile is aligned to nitride spacers 118/offset spacers 120. In the completed device, the source/drain extension implants are typically required to diffuse at least about five nm into the channel. Therefore, if each of nitride spacers 118 has a thickness of about three nm and each of offset spacers 120 has a thickness of about 14 nm, then during the final anneal (described below) the source/drain extension implants would need to be diffused a total distance of about 22 nm (i.e., the combined thicknesses of the spacers plus the five nm depth into the channel). If the spacer dimensions are reduced then the source/drain extension implant dose may be reduced and/or the duration of the final anneal can be reduced, accordingly.

Figure 2:
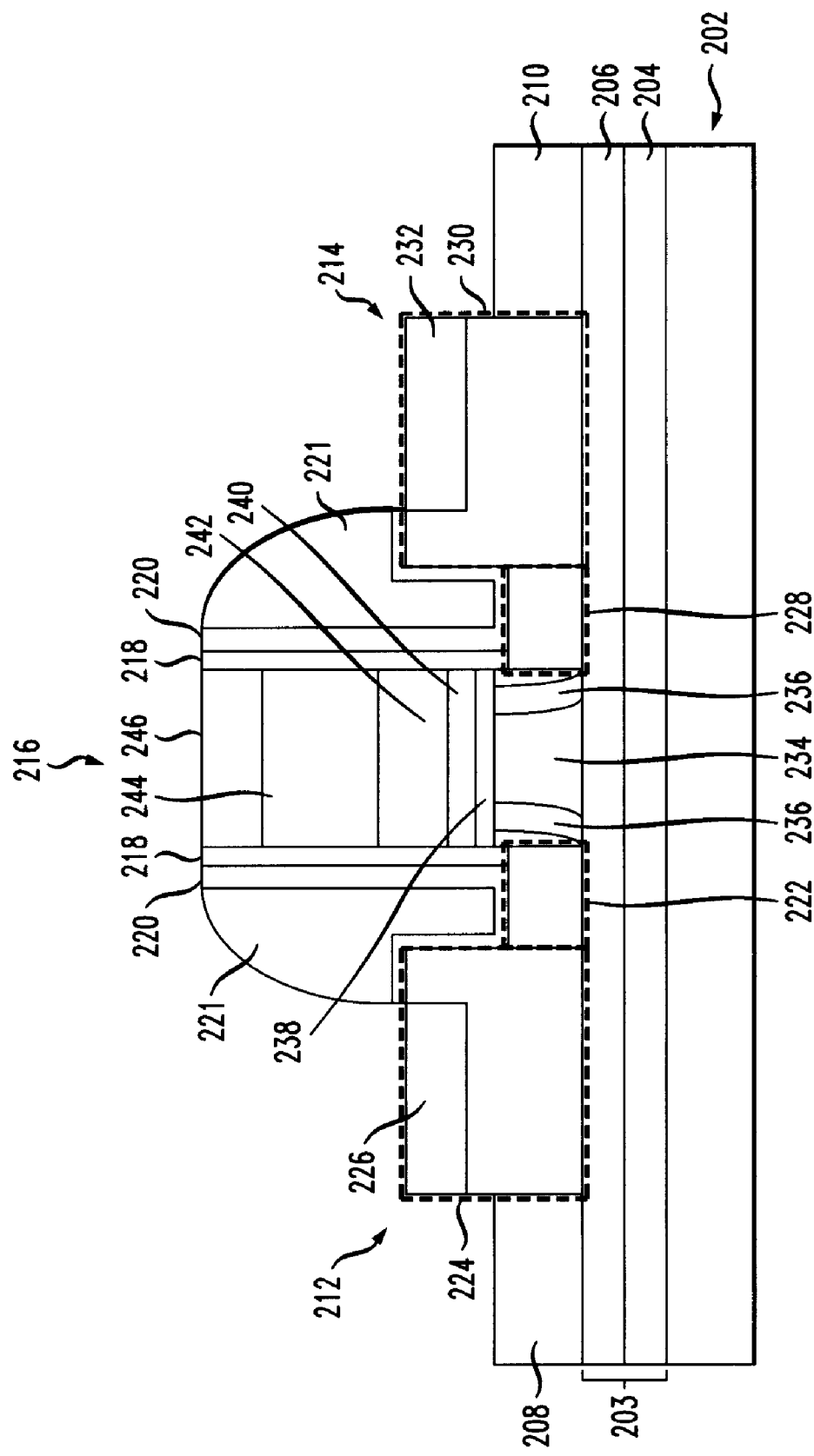
FIG. 2 is a cross-sectional diagram illustrating another exemplary MOSFET device according to an embodiment of the present invention.

FIG. 2 is a cross-sectional diagram illustrating exemplary MOSFET device 200. According to an exemplary embodiment, MOSFET device 200 is either an NFET device or a PFET device. MOSFET device 200 comprises substrate 202 having STI regions 208/210 and source/drain regions 212/214 formed therein, gate stack 216 separated from substrate 202 by interfacial oxide layer 238 and nitride spacers 218/ offset spacers 220/source/drain diffusion spacers 221 adjacent to gate stack 216.

Substrate 202 comprises a SOI substrate. As will be described in detail below, substrate 202 is formed from a thin SOI wafer, such as an UTSOI wafer or an ETSOI wafer having a BOX layer present between two semiconductor layers. According to an exemplary embodiment, each of the semiconductor layers comprises Si.

The BOX layer forms BOX layer 203 in substrate 202. According to the present teachings, at least a portion of BOX layer 203 is configured to act as a primary background oxygen getterer of the device, i.e., to attract any background oxygen present. Namely, at least a portion of BOX layer 203 is configured to be Si-rich and/or is implanted with an oxygen getterer species, such as one or more of As and B. According to the exemplary embodiment shown in FIG. 2, BOX layer 203 is configured, in its entirety, to be Si-rich, with an oxygen getterer species implanted into region 206.

As the primary background oxygen getterer, BOX layer 203 serves to prevent regrowth of interfacial oxide layer 238 that separates gate stack 216 from substrate 202. The regrowth of the interfacial oxide layer and its effect on device performance were described above.

Source/drain region 212 comprises a source/drain extension region 222 that is continuous with a raised source/drain region 224 (having silicide region 226 formed on a top surface thereof). Each of source/drain extension region 222 and raised source/drain region 224 are doped. Suitable dopants will vary depending on whether MOSFET device 200 is an NFET or a PFET device. By way of example only, when MOSFET device 200 is an NFET device, suitable dopants for each of source/drain extension region 222 and raised source/drain region 224 include, but are not limited to, one or more of As, P and Sb. When MOSFET device 200 is a PFET device, suitable dopants for each of source/drain extension region 222 and raised source/drain region 224 include, but are not limited to, one or more of B and $BF_2$. Source/drain region 214 comprises a source/drain extension region 228 that is continuous with a raised source/drain region 230 (having silicide region 232 formed on a top surface thereof). As above, when MOSFET device 200 is an NFET device, suitable dopants for each of source/drain extension region 228 and raised source/drain region 230 include, but are not limited to, one or more of As, P and Sb. When MOSFET device 200 is a PFET device, suitable dopants for each of source/drain extension region 228 and raised source/drain region 230 include, but are not limited to, one or more of B and $BF_2$.

Well region 234 is present between source/drain region 212 and source/drain region 214. Well region 234 serves as a channel of the device. According to an exemplary embodiment, MOSFET device 200 is either an NFET or a PFET device and well region 234 comprises either a p-well implant (such as one or more of B, $BF_2$ and In) or a n-well implant (such as one or more of As, P and Sb), respectively. A halo region 236 is present on either side of well region 234. When MOSFET device 200 is an NFET device, halo regions 236 can comprise one or more of B and $BF_2$. When MOSFET device 200 is a PFET device, halo regions 236 can comprise one or more of As, P and Sb.

Gate stack 216 comprises high-K layer 240, metal gate layer 242 over high-K layer 240 and silicon layer 244 over a side of metal gate layer 242 opposite high-K layer 240. High-K layer 240 can comprise one or more of $HfO_2$, $Ta_2O_5$, $TiO_2$, $Al_2O_3$ and $La_2O_5$. Metal gate layer 242 can comprise one or more of Ta, TaN, TaCN, TaSiN, TaSi, AlN, W and Mo. Silicon layer 244 can comprise one or more of amorphous Si or poly-Si. Silicon layer 244 can be doped. When MOSFET device 200 comprises an NFET device, silicon layer 244 can be doped with one or more of As, P and Sb. When MOSFET device 200 comprises a PFET device, silicon layer 244 can be doped with one or more of B and $BF_2$. Silicon layer 244 has silicide layer 246 formed thereon.

Metal gate layer 242 has a thickness that is greater than a thickness of metal gate layer 142, described, for example, in conjunction with the description of FIG. 1, above. According to an exemplary embodiment, metal gate layer 242 has a thickness of between about 20 nm and about 50 nm, and silicon layer 244 has a thickness of between about 50 nm and about 80 nm. As described above, the thickness of the metal gate layer can be varied to enhance performance of the device. As shown in FIG. 2, the thickness of the metal gate layer is increased to impart favorable stress to the device. Stress scales almost linearly with the metal gate layer thickness. For a metal gate layer that is about 10 nm thick, the stress levels can enhance MOSFET device drive current by around five percent (%). Therefore, by way of example only, a metal gate layer having a thickness of between about 30 and about 70 nm could correlate to between about a 15% and about a 35% increase in MOSFET device performance.

As highlighted above, interfacial oxide layer 238 separates gate stack 216 from substrate 202. According to an exemplary embodiment, interfacial oxide layer 238 comprises $SiO_2$. As above, BOX layer 203 is configured to prevent regrowth of interfacial oxide layer 238, and as such is located closer to interfacial oxide layer 238 than in conventional devices.

As shown in FIG. 2, nitride spacers 218 are present adjacent to gate stack 216 and offset spacers 220 are present between nitride spacers 218 and source/drain diffusion spacers 221. According to an exemplary embodiment, offset spacers 220 comprise oxide spacers and source/drain diffusion spacers 221 comprise nitride spacers. Nitride spacers 218 and offset spacers 220 are configured to have a combined thickness to set proper overlap capacitance for RTA-source/drain extension flow (see above description).

Figure 3:
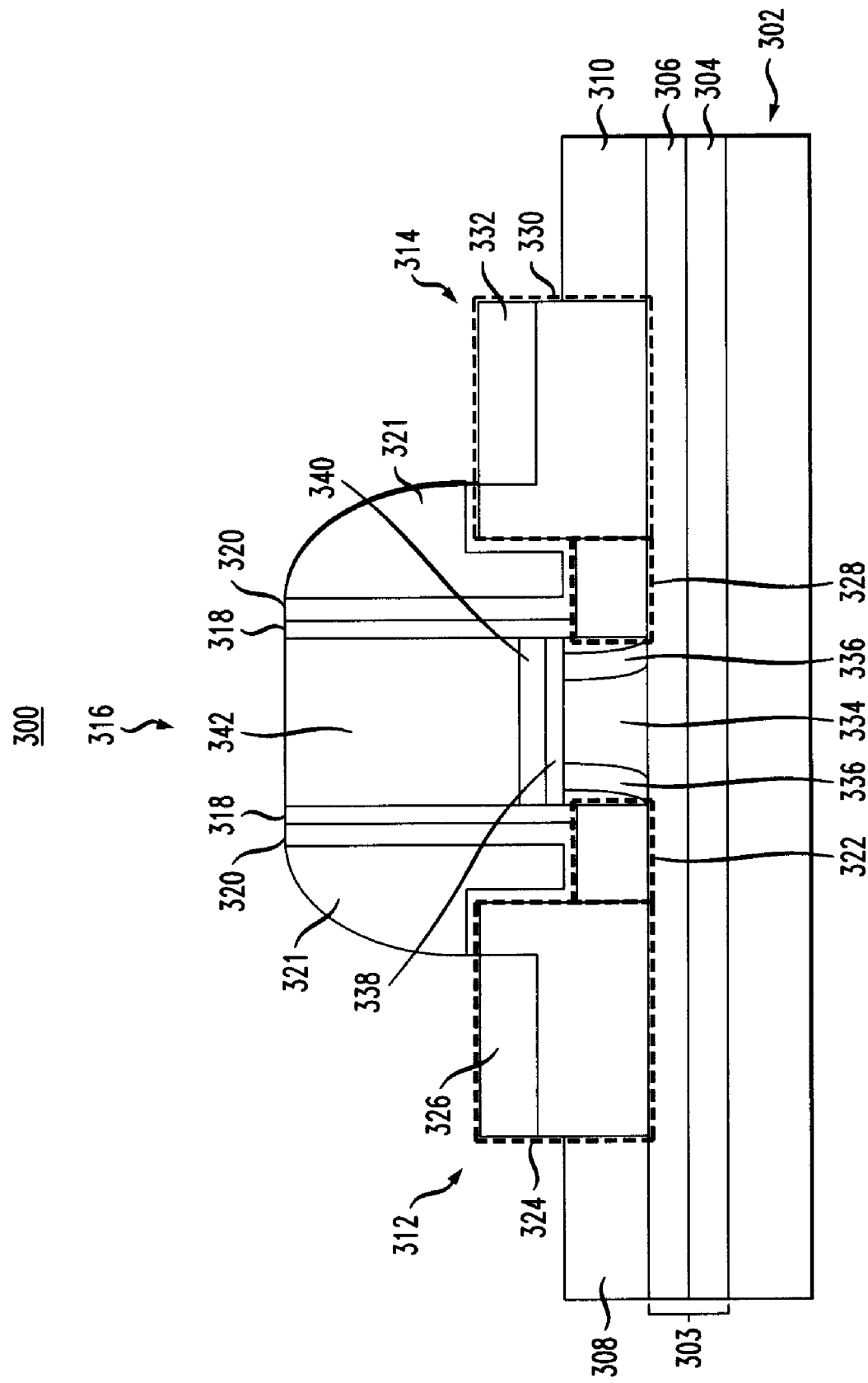
FIG. 3 is a cross-sectional diagram illustrating yet another exemplary MOSFET device according to an embodiment of the present invention.
Figure 4B:
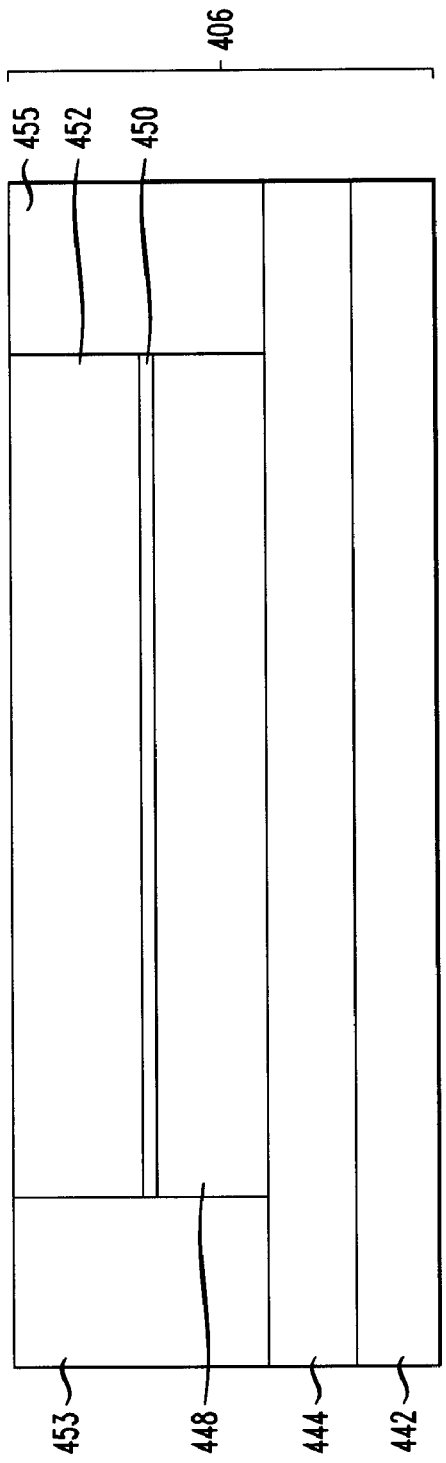
Figure 4B:
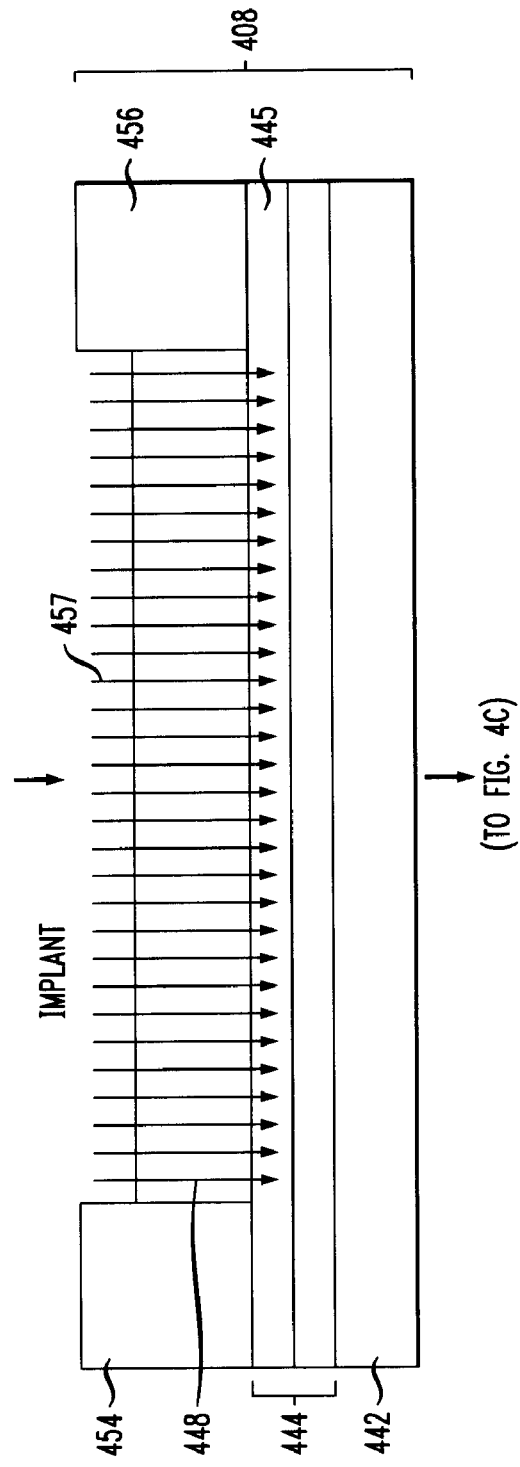
Figure 4C:
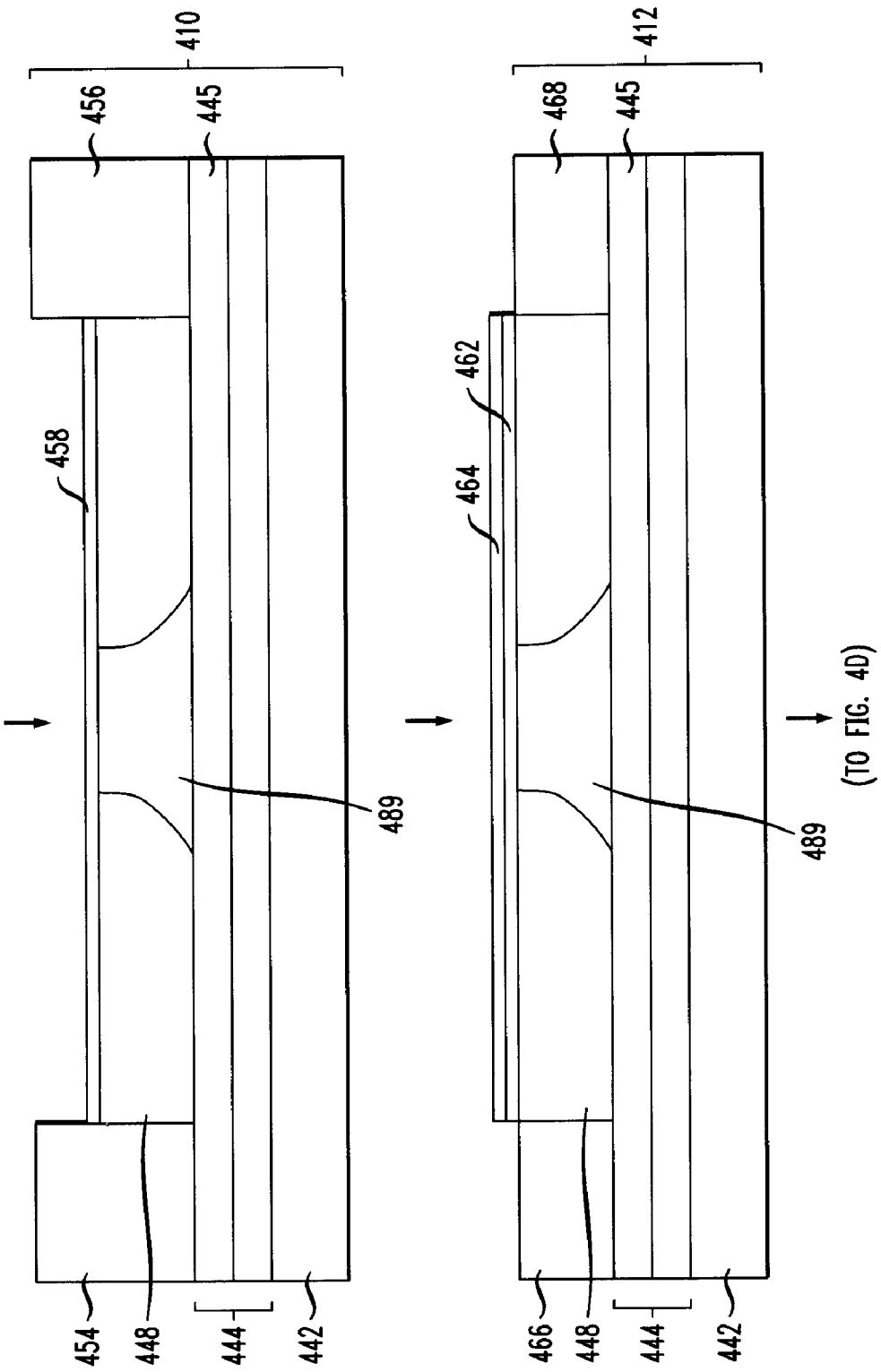
Figure 4D:
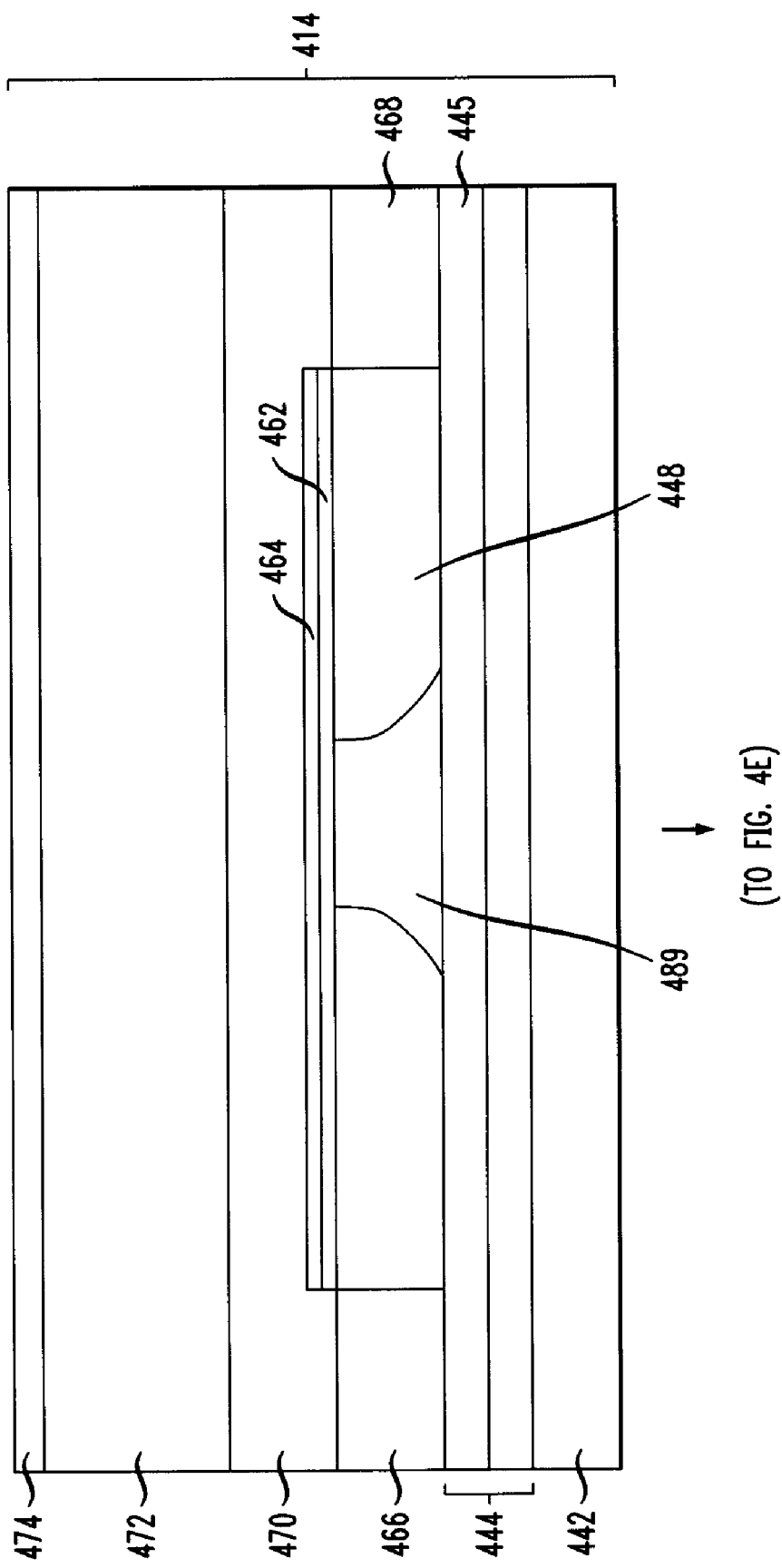
Figure 4G:
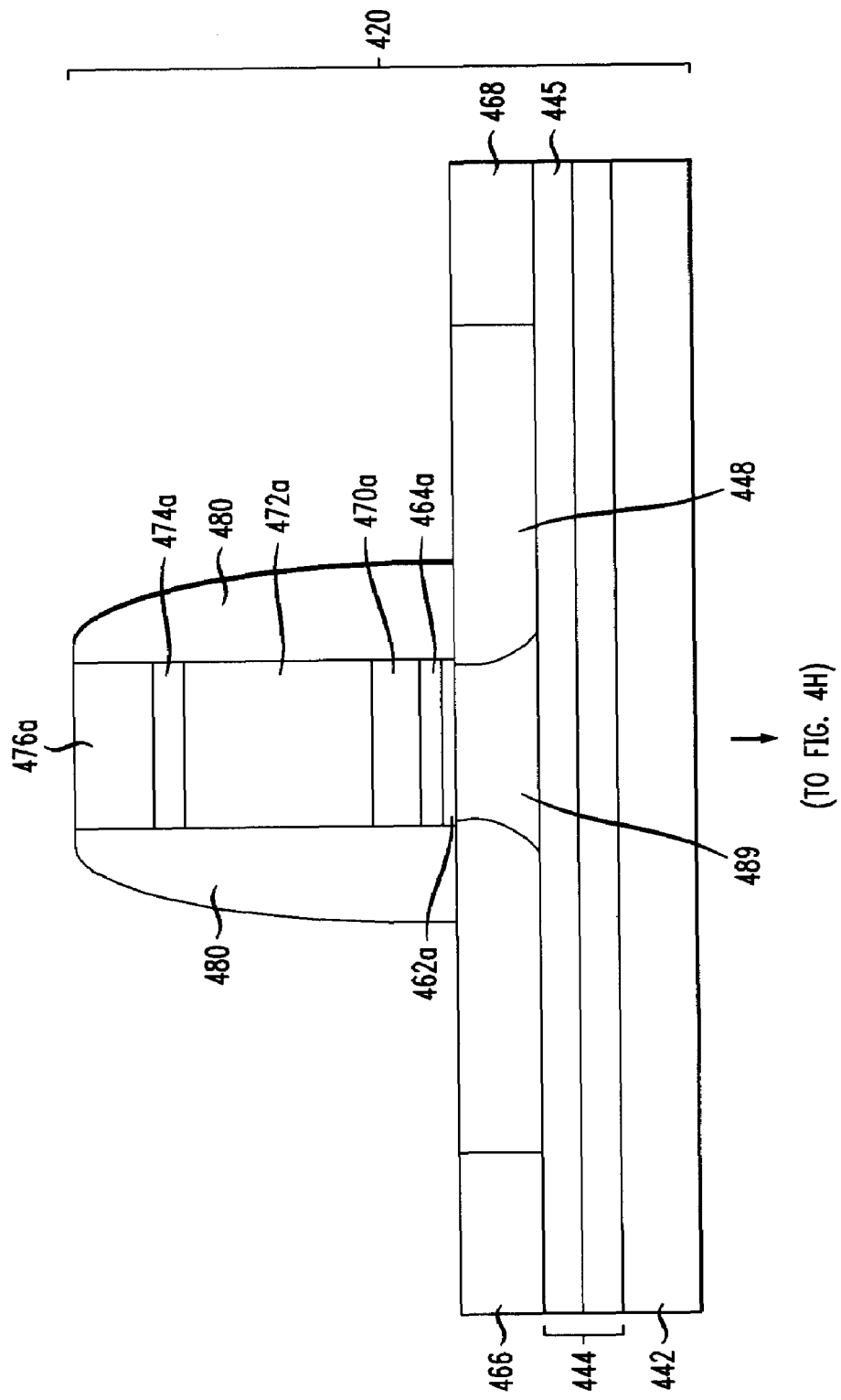
Figure 4H:
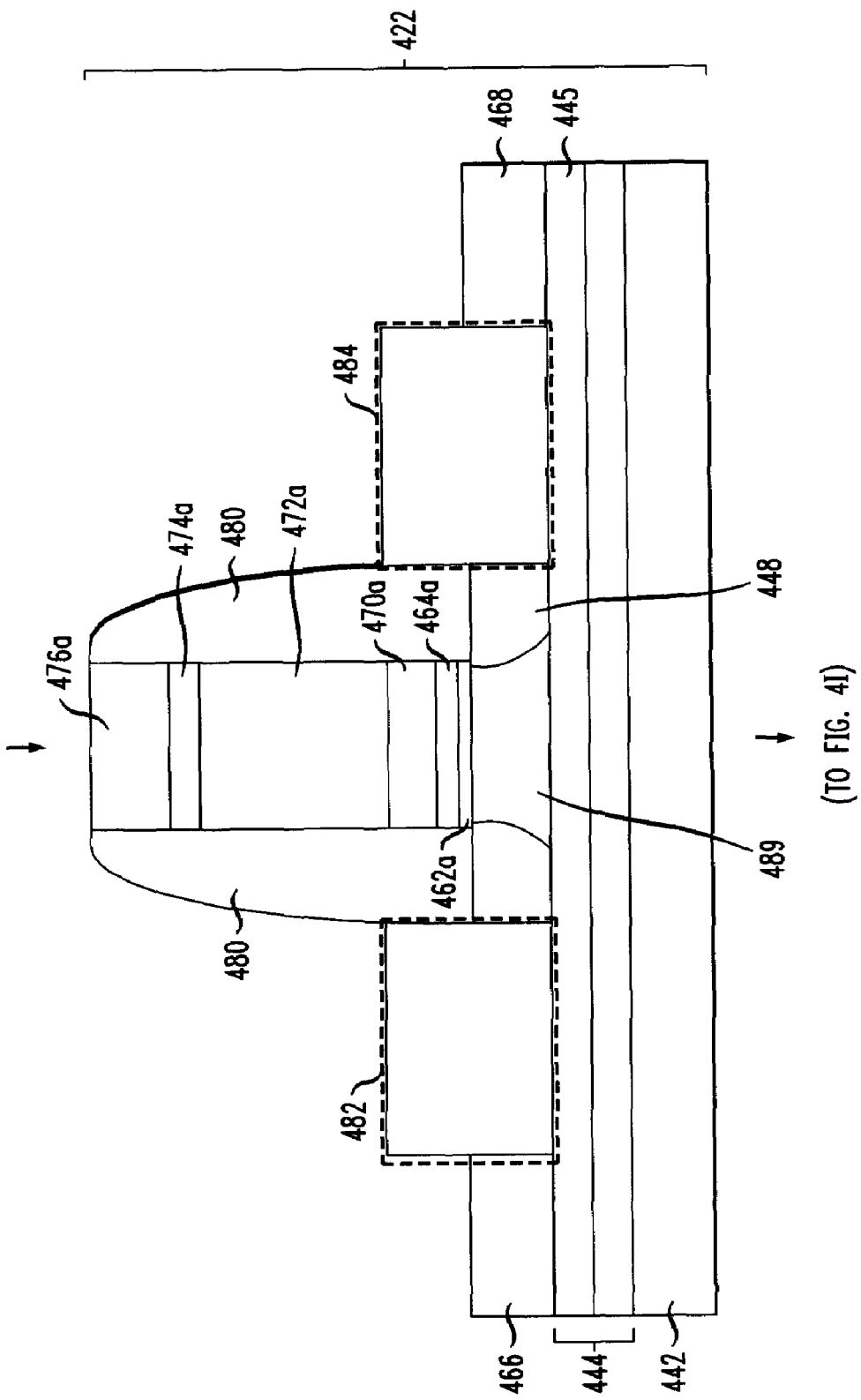
Figure 4I:
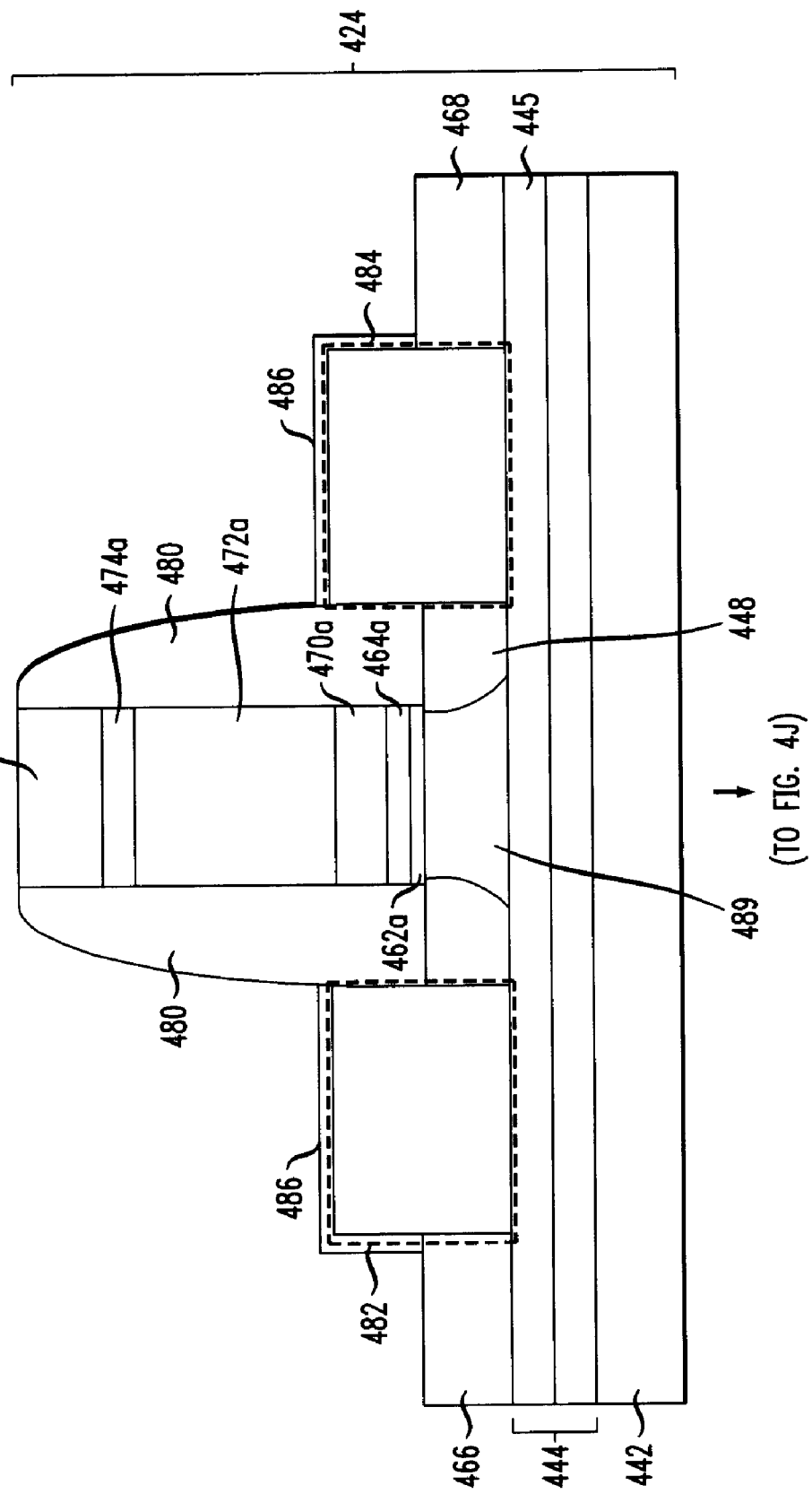
Figure 4J:
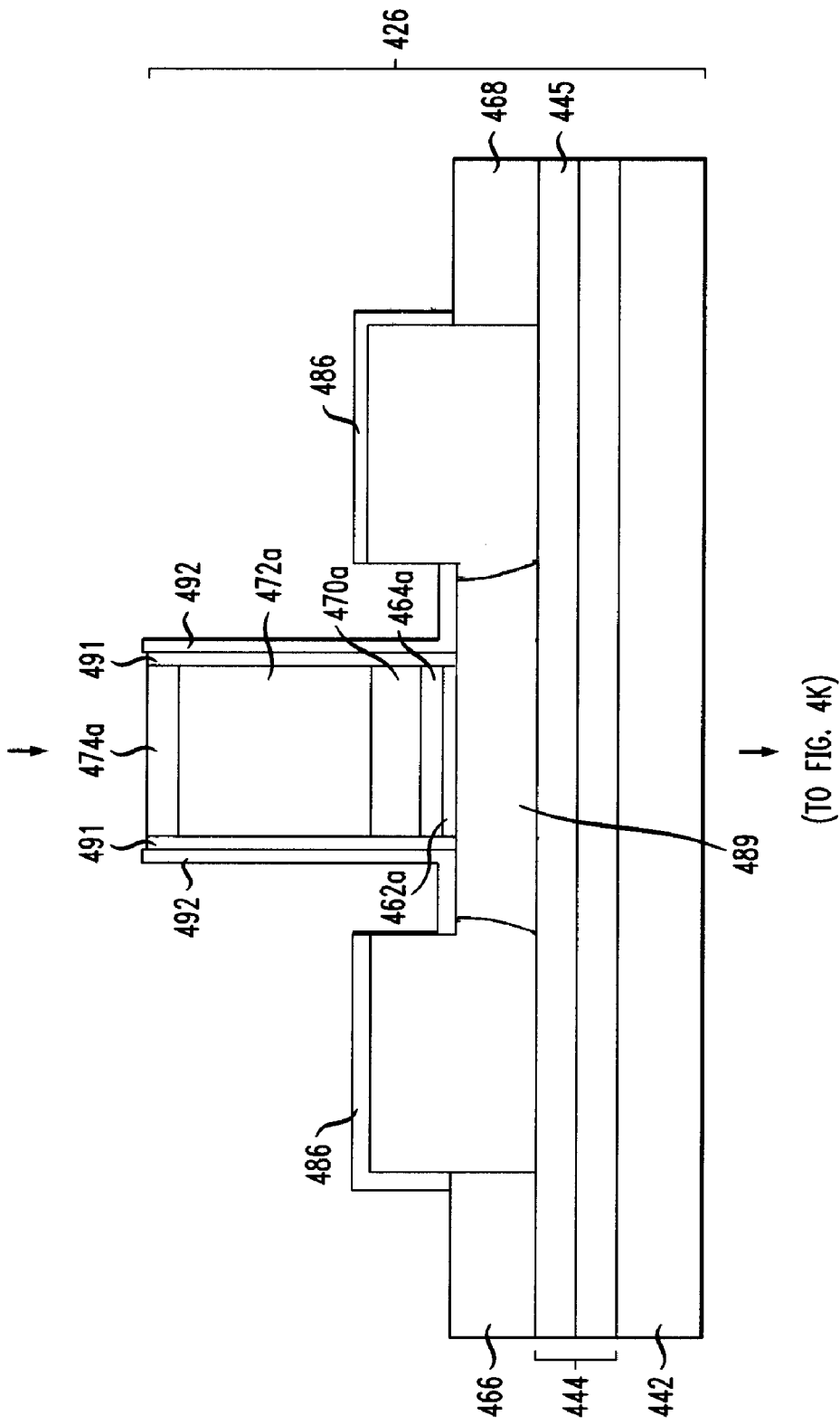
Figure 4K:
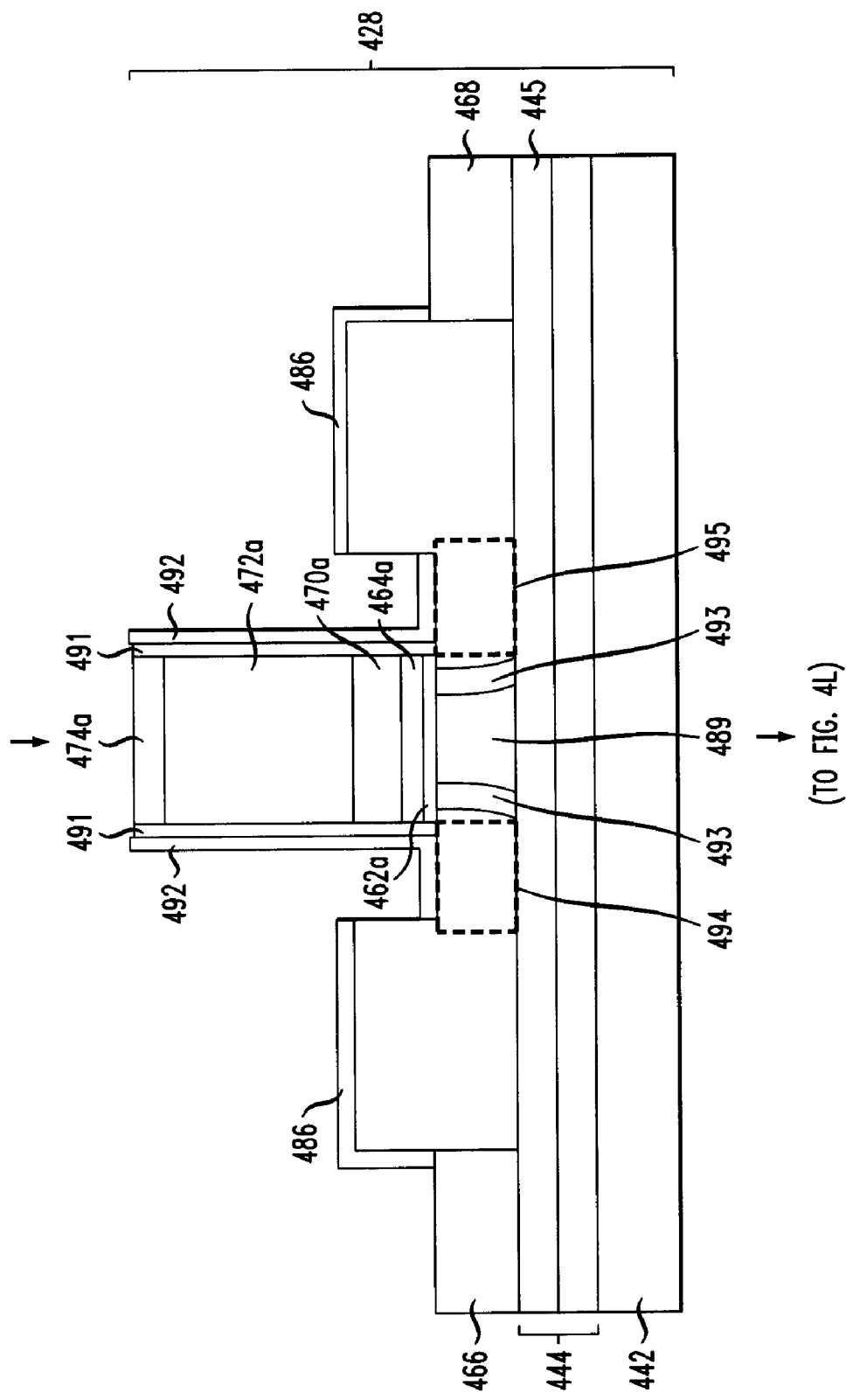
Figure 4M:
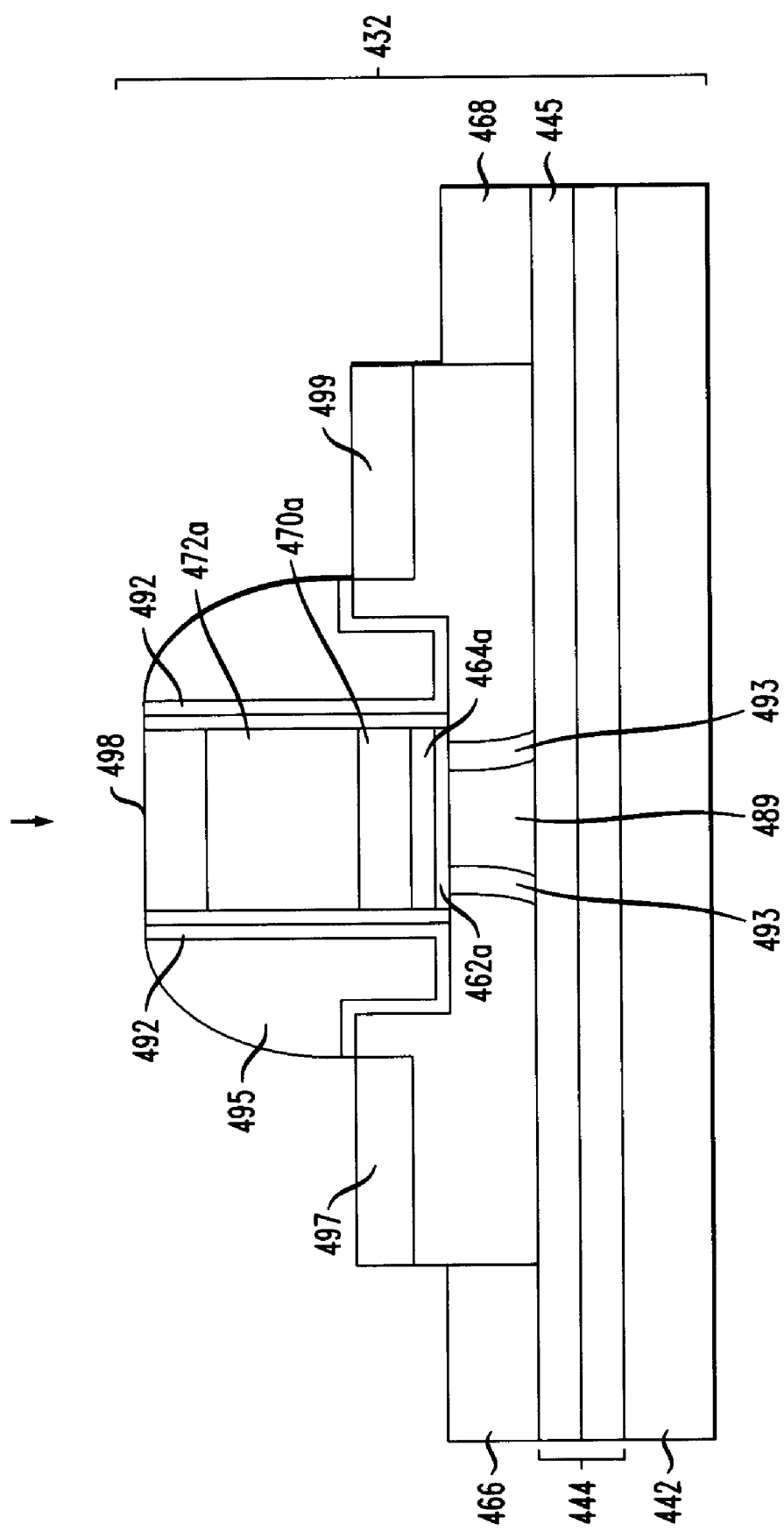

FIG. 3 is a cross-sectional diagram illustrating exemplary MOSFET device 300. According to an exemplary embodiment, MOSFET device 300 is either an NFET device or a PFET device. MOSFET device 300 comprises substrate 302 having STI regions 308/310 and source/drain regions 312/314 formed therein, gate stack 316 separated from substrate 302 by interfacial oxide layer 338 and nitride spacers 318/offset spacers 320/source/drain diffusion spacers 321 adjacent to gate stack 316.

Substrate 302 comprises a SOI substrate. As will be described in detail below, substrate 302 is formed from a thin SOI wafer, such as an UTSOI wafer or an ETSOI wafer having a BOX layer present between two semiconductor layers. According to an exemplary embodiment, each of the semiconductor layers comprises Si.

The BOX layer forms BOX layer 303 in substrate 302. According to the present teachings, at least a portion of BOX layer 303 is configured to act as a primary background oxygen getterer of the device, i.e., to attract any background oxygen present. Namely, at least a portion of BOX layer 303 is configured to be Si-rich and/or is implanted with an oxygen getterer species such as one or more of As and B. According to the exemplary embodiment shown in FIG. 3, BOX layer 303 is configured, in its entirety, to be Si-rich, with an oxygen getterer species implanted into region 306.

As the primary background oxygen getterer, BOX layer 303 serves to prevent regrowth of interfacial oxide layer 338 that separates gate stack 316 from substrate 302. The regrowth of the interfacial oxide layer and its effect on device performance was described above.

Source/drain region 312 comprises a source/drain extension region 322 that is continuous with a raised source/drain region 324 (having silicide region 326 formed on a top surface thereof). Each of source/drain extension regions 322 and raised source/drain region 324 are doped. Suitable dopants will vary depending on whether MOSFET device 300 is an NFET or a PFET device. By way of example only, when MOSFET device 300 is an NFET device, suitable dopants for each of source/drain extension region 322 and raised source/drain region 324 include, but are not limited to, one or more of As, P and Sb. When MOSFET device 300 is a PFET device, suitable dopants for each of source/drain extension region 322 and raised source/drain region 324 include, but are not limited to, one or more of B and $BF_2$. Source/drain region 314 comprises a source/drain extension region 328 that is continuous with a raised source/drain region 330 (having silicide region 332 formed on a top surface thereof). As above, when MOSFET device 300 is an NFET device, suitable dopants for each of source/drain extension region 328 and raised source/drain region 330 include, but are not limited to, one or more of As, P and Sb. When MOSFET device 300 is a PFET device, suitable dopants for each of source/drain extension region 328 and raised source/drain region 330 include, but are not limited to, one or more of B and $BF_2$.

Well region 334 is present between source/drain region 312 and source/drain region 314. Well region 334 serves as a channel of the device. According to an exemplary embodiment, MOSFET device 300 is either an NFET or a PFET device and well region 334 comprises either a p-well implant (such as one or more of B, $BF_2$ and In) or an n-well implant (such as one or more of As, P and Sb), respectively. A halo region 336 is present on either side of well region 334. When MOSFET device 300 is an NFET device, halo regions 336 can comprise one or more of B and $BF_2$. When MOSFET device 300 is a PFET device, halo regions 336 can comprise one or more of As, P and Sb.

Gate stack 316 comprises high-K layer 340 and metal gate layer 342 over high-K layer 340. High-K layer 340 can comprise one or more of $HfO_2$, $Ta_2O_5$, $TiO_2$, $Al_2O_3$ and $La_2O_5$. Metal gate layer 342 can comprise one or more of Ta, TaN, TaCN, TaSiN, TaSi, AlN, W and Mo. Gate stack 316 is a fully metal gate stack, i.e., does not contain a silicon layer. In the exemplary embodiment shown illustrated in FIG. 3, the overall thickness of the gate stack is defined as a combined thickness of the high-K layer and the metal gate layer.

Metal gate layer 342 has a thickness that is greater than a thickness of metal gate layer 142 and metal gate layer 242, described, for example, in conjunction with the description of FIGS. 1 and 2, respectively, above. While having a thicker metal gate layer increases favorable stress and mobility and enhances drive current (see above), there can be thicknesses beyond which certain factors, such as parasitic capacitance, can become an issue. Thus, according to an exemplary embodiment, metal gate layer 342 has a thickness of between about 50 nm and about 100 nm.

As highlighted above, interfacial oxide layer 338 separates gate stack 316 from substrate 302. According to an exemplary embodiment, interfacial oxide layer 338 comprises $SiO_2$. As above, BOX layer 303 is configured to prevent regrowth of interfacial oxide layer 338, and as such is located closer to interfacial oxide layer 338 than in conventional devices.

As shown in FIG. 3, nitride spacers 318 are present adjacent to gate stack 316 and offset spacers 320 are present between nitride spacers 318 and source/drain diffusion spacers 321. According to an exemplary embodiment, offset spacers 320 comprise oxide spacers and source/drain diffusion spacers 321 comprise nitride spacers. Nitride spacers 318 and offset spacers 320 are configured to have a combined thickness to set proper overlap capacitance for RTA-source/drain extension flow (see above description).

FIGS. 4A-M are cross-sectional diagrams illustrating exemplary methodology 400 for fabricating a MOSFET device. As will be apparent from the following description, methodology 400 is directed to fabricating a metal-gated MOSFET device having the same gate stack configuration as MOSFET device 200, described, for example, in conjunction with the description of FIG. 2, above. However, since the MOSFET device configurations described above differ from one another based primarily on the gate stack configuration of each device, methodology 400 is easily adaptable to fabricate MOSFET device 100 and/or MOSFET device 300, described, for example, in conjunction with the description of FIGS. 1 and 3, respectively, above.

In step 402, SOI wafer 440 is provided. According to an exemplary embodiment, SOI wafer 440 comprises either an UTSOI substrate or an ETSOI wafer having semiconductor layer 442, BOX layer 444 over semiconductor layer 442 and semiconductor layer 446 over a side of BOX layer 444 opposite semiconductor layer 442. According to an exemplary embodiment, both semiconductor layers 442 and 446 comprise Si. As described above, SOI wafer 440 will serve as a substrate of the device. Further, if SOI wafer 440 comprises an UTSOI then semiconductor layer 446 has a thickness of between about 13 nm and about 20 nm (as described above). If SOI wafer 440 comprises an ETSOI then semiconductor layer 446 has a thickness of between about seven nm and about 10 nm (as described above).

According to an exemplary embodiment, an SOI wafer is provided with a top semiconductor layer having a thickness that is, e.g., greater than 20 nm. The top semiconductor layer is then thinned using oxidation and wet etching (such as hydrofluoric (HF) acid etching) to the correct thickness for semiconductor layer 446. This thinning step is not necessary if SOI wafer 440 can be provided with semiconductor layer 446 having the proper thickness.

According to an exemplary embodiment, BOX layer 444 comprises $SiO_2$. Further, BOX layer 444 is configured to be Si-rich. Namely, Si is implanted into BOX layer 444 rendering BOX layer 444 Si-rich.

In step 404, an oxide layer and a nitride layer are provided that will be used during the formation of STI regions 453 and 455 (described below). Namely, an oxide layer is deposited over semiconductor layer 446. A nitride layer is then deposited over a side of the oxide layer opposite semiconductor layer 446. Lithography is used to pattern a mask over what will be the active area of the device, i.e., the area in which device structures, such as source/drain regions, a channel and a gate stack, will be formed. Reactive ion etching (RIE) is then used to etch semiconductor layer 446, the oxide layer and the nitride layer so as to form semiconductor layer 448, oxide layer 450 and nitride layer 452, respectively.

In step 406, an STI oxide is deposited followed by a densification anneal. Chemical-mechanical planarization (CMP) is then performed to remove excess STI oxide, with nitride layer 452 acting as an etch stop. As such STI regions 453 and 455 are formed having a thickness equivalent to a combined thickness of semiconductor layer 448/oxide layer 450/nitride layer 452.

In step 408, nitride layer 452 is removed. According to an exemplary embodiment, nitride layer 452 is removed using hot phosphoric acid ($H_3PO_4$), i.e., at a temperature of greater than about 150 degrees Celsius (° C.). Oxide layer 450 serves to protect semiconductor layer 448 during removal of nitride layer 452. Once nitride layer 452 has been removed, oxide layer 450 is then removed. According to an exemplary embodiment, oxide layer 450 is removed using a wet etching process, such as HF acid etching. The process of removing oxide layer 450 will also further remove some of the STI oxide (deposited in step 406, above), thus reducing the thickness of the STI regions (i.e., forming STI regions 454 and 456).

At least one oxygen getterer species is implanted into at least a portion, e.g., portion 445, of BOX layer 444 (as shown illustrated by arrows 457). As described above, suitable oxygen getterer species include, but are not limited to, one or more of As and B. According to an exemplary embodiment, the oxygen getterer species implant, at a dose of between about $1 \times 10^{18}$ atoms per cubic centimeter (atoms/cm$^3$) and about $10 \times 10^{18}$ atoms/cm$^3$, is peaked inside a top portion (i.e., portion 445) of BOX layer 444. While the embodiment shown illustrated in FIGS. 4A-M includes a BOX layer that is both Si-rich and implanted with an oxygen getterer species, this is not the only BOX layer configuration that may be implemented in the present techniques. For example, the BOX layer can be configured to be Si-rich and not implanted with an oxygen getterer species. Conversely, the BOX layer can be implanted with an oxygen getterer species but not configured to be Si-rich.

In step 410, following the implantation of the oxygen getterer species into the BOX layer, sacrificial oxide layer 458 is formed on semiconductor layer 448. According to an exemplary embodiment, sacrificial oxide layer 458 is grown on semiconductor layer 448 using thermal oxidation.

An implanted well region, i.e., well region 489, is then formed in semiconductor layer 448. Namely, lithography is used to pattern a resist mask over sacrificial oxide layer 458 with a footprint and location of the well region. When the device is an NFET device, p-well implants are then introduced into semiconductor layer 448 in the well region. Suitable p-well implants include, but are not limited to, B, $BF_2$ and In. Following the implantation, the mask is removed. Similarly, when the device is a PFET device, n-well implants are introduced into semiconductor layer 448 in the well region. Suitable n-well implants include, but are not limited to, As, P and Sb. Following the implantation, the mask is removed. The well region is then annealed.

In step 412, sacrificial oxide layer 458 (formed in step 410, described above) is removed, i.e., stripped, from semiconductor layer 448. According to an exemplary embodiment, sacrificial oxide layer 458 is stripped using a wet etch, such as HF acid etching. The process of removing sacrificial oxide layer 458 will also remove some more of the STI oxide thus further reducing the thickness of the STI regions (i.e., forming STI regions 466 and 468).

Interfacial oxide layer 462 is then formed over semiconductor layer 448. According to an exemplary embodiment, interfacial oxide layer 462 comprises $SiO_2$ (as described above) and is grown over semiconductor layer 448 using thermal oxidation. High-K layer 464 is then deposited over interfacial oxide layer 462. The high-K layer can comprise one or more of $HfO_2$, $Ta_2O_5$, $TiO_2$, $Al_2O_3$ and $La_2O_5$ (as described above).

In step 414, metal gate layer 470 is deposited over STI regions 466 and 468/high-K layer 464. As described above, the metal gate layer can comprise one or more of Ta, TaN, TaCN, TaSiN, TaSi, AlN, W and Mo. Silicon layer 472 is then deposited over metal gate layer 470. As described above, the silicon layer can comprise one or more of amorphous Si or poly-Si. High-K layer 464, metal gate layer 470 and silicon layer 472 will be used to form a gate stack of the device.

Metal gate layer 470 will have a thickness of between about 20 nm and about 50 nm, and silicon layer 472 will have a thickness of between about 50 nm and about 80 nm. See, for example, FIG. 2 (described above). However, as highlighted above, the thickness of the metal gate layer and/or the silicon layer can be varied. For example, the metal gate layer can be configured to have a thickness of about 10 nm, and the silicon layer can be configured to have a thickness of between about 40 nm and about 90 nm. See, for example, FIG. 1 (described above). Alternatively, the gate stack can be a fully metal gate stack, i.e., does not contain a silicon layer, and the metal gate layer can be configured to have a thickness of between about 50 nm and about 100 nm. See, for example, FIG. 3 (described above).

Screen oxide layer 474 is formed over silicon layer 472. According to an exemplary embodiment, screen oxide layer 474 comprises oxidized silicon, e.g., oxidized poly-Si when silicon layer 472 comprises poly-Si, and is formed using either a chemical oxidation, an ozone or a thermal process. Screen oxide layer 474, which can have a thickness of between about three nm and about five nm, serves to trap and thus prevent metal contaminants from getting into the gate stack during the following doping of silicon layer 472. For example, since heavy metal atoms have a much shorter implant range than the dopants, the heavy metal atoms end up in the screen oxide layer and can be removed. Further, the screen oxide layer serves to randomize (scatter) the ion species (dopants) implanted into the gate stack, so that ion channeling does not occur through silicon layer 472.

Silicon layer 472 is then doped. This step is a gate stack doping step. Namely, lithography is used to pattern a resist mask with the footprint and location of the gate stack over silicon layer 472. When the device is an NFET device, a dopant(s), such as one or more of As, P and Sb is then introduced into silicon layer 472. Following the doping, the mask is removed. Similarly, when the device is a PFET device, a dopant(s), such as one or more of B and $BF_2$ is introduced into silicon layer 472. Following the doping, the mask is removed. It is notable that when the gate stack is a fully metal gate stack and does not contain a silicon layer, this doping step is not performed.

In step 416, nitride gate cap 476 is deposited over screen oxide layer 474. According to an exemplary embodiment, nitride gate cap 476 comprises silicon nitride (SiN). Nitride gate cap 476 will be used to shield the gate stack during selective raised source/drain epitaxy (see below).

In step 418, the gate stack is defined. Namely, lithography is used to pattern a resist mask with the footprint and location of the gate stack over nitride gate cap 476. RIE, or any other suitable etching process, is then used to define the gate stack. Specifically, interfacial oxide layer 462/high-K layer 464/metal gate layer 470/silicon layer 472/screen oxide layer 474/nitride gate cap 476 are etched to form interfacial oxide layer 462a/high-K layer 464a/metal gate layer 470a/silicon layer 472a/screen oxide layer 474a/nitride gate cap 476a, respectively.

In step 420, a nitride layer is deposited over the device and nitride-selective RIE is used to form nitride disposable spacers 480. In step 422, an epitaxial pre-clean is used to clean portions of semiconductor layer 448 that will be used for selective raised source/drain epitaxy (see below). Suitable epitaxial pre-cleans include, but are not limited to, a wet HF acid etching process followed by a bake in hydrogen at around 800° C. to eliminate all oxygen from the surface, i.e., of semiconductor layer 448, prior to epitaxy growth.

Following the epitaxial pre-cleaning step, epitaxy is used to selectively form raised source/drain regions 482 and 484 extending above semiconductor layer 448 adjacent to opposite sides of the gate stack.

In step 424, screen oxide layer 486 is formed over each of raised source/drain regions 482 and 484. According to an exemplary embodiment, screen oxide layer 486 comprises $SiO_2$ and is formed over the raised source/drain regions using either a chemical oxidation, a an ozone or a thermal process. Dopants are then implanted into raised source/drain regions 482 and 484. Namely, lithography is used to pattern a resist mask over all but the raised source/drain regions. When the device is an NFET device, a deep source/drain implant(s), such as one or more of As, P and Sb is then introduced into source/drain regions 482 and 484. Following the implantation, the mask is removed. Similarly, when the device is a PFET device, a deep source/drain implant(s), such as one or more of B and $BF_2$ is introduced into source/drain regions 482 and 484. Following the implantation, the mask is removed. As will be described below, source/drain extension regions will be formed to extend the raised source/drain regions to the well region.

In step 426, nitride disposable spacers 480 and nitride gate cap 476a are removed, e.g., using hot $H_3PO_4$. Nitride spacers 491 are applied in place of nitride disposable spacers 480 adjacent to the gate stack.

Offset spacers are then formed adjacent to nitride spacers 491/over semiconductor layer 448. The offset spacers comprise oxide spacers (as described above) and can be formed by depositing an oxide layer over the device and using oxide-selective RIE to form offset spacers 492. A RTA process, such as spike RTA, is then used to both activate and diffuse the gate doping, if present, as well as the deep source/drain implants.

In step 428, halo and source/drain extension regions of the device are formed. Namely, lithography is used to pattern a resist mask selectively covering the raised source/drain regions of the device and the gate stack. According to the exemplary embodiment described below, the same resist mask(s) is used for both the halo implants and the source/drain extension implants. Alternatively, one resist mask can be used for the halo implants, and another resist mask can be used for the source/drain extension implants. When the device is an NFET device, a halo implant(s), such as one or more of B and $BF_2$, is introduced into the well region forming halo regions 493. A source/drain extension implant(s), such as one or more of As, P and Sb, is introduced between the raised source/drain regions and the well region, forming source/drain extension regions 494 and 495 that extend the raised source/drain regions to the well region. Following the implantation, the mask is removed. Similarly, when the device is a PFET device, a halo implant(s), such as one or more of As, P and Sb, is introduced into the well region forming halo regions 493. A source/drain extension implant (s), such as one or more of B and $BF_2$, is introduced between the raised source/drain regions and the well region, forming source/drain extension regions 494 and 495 adjacent to halo regions 493 that extend the raised source/drain regions to the well region. Following the implantation, the mask is removed.

In step 430, screen oxide layer 474a is removed and replaced with oxide liner 494. Oxide liner 494 will protect silicon layer 472a during the following source/drain diffusion spacer formation. Screen oxide layer 486 is also removed and replaced with offset spacers 496. Offset spacers 496 can comprise oxide spacers (as described above). Removing screen oxide layers 474a and 486 serves to remove any metallic contaminants that may have been trapped by these layers during the implantation steps described above.

Source/drain diffusion spacers 495 are formed adjacent to offset spacers 492. As described above, source/drain diffusion spacers 495 can comprise nitride spacers. According to an exemplary embodiment, source/drain diffusion spacers 495 are formed by first depositing a nitride layer over the device and then using nitride-selective RIE to form source/drain diffusion spacers 495 adjacent to offset spacers 492/over a portion of offset spacers 496.

An anneal process is then used to activate the halo and source/drain extension implants. Suitable anneal processes include, but are not limited to, RTA processes, such as spike RTA, laser RTA and/or flash RTA. RTA will serve to activate the halo and source/drain extension implants without diffusing the implants into the BOX layer, and will minimize regrowth of the interfacial oxide layer.

In step 432, silicide regions are formed over the raised source/drain regions and the gate stack silicon layer. Namely, a silicide pre-cleaning process is performed, followed by deposition of a metal over the raised source/drain regions and over silicon layer 472a. Suitable silicide metals include, but are not limited, nickel (Ni) and cobalt (Co). A silicide-forming anneal is then performed to form silicide regions 497, 498 and 499. Any excess metal can be removed, e.g., using CMP.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for fabricating a metal-oxide semiconductor device, comprising the steps of:
   providing a wafer having a buried oxide layer between a first semiconductor layer and a second semiconductor layer, wherein the buried oxide layer is configured, in its entirety, to be silicon-rich;
   implanting one or more oxygen getterer species into the buried oxide layer, wherein the oxygen getterer species implant is peaked inside a top portion of the buried oxide layer adjacent to the first semiconductor layer;
   forming a well region in the first semiconductor layer;
   forming an interfacial oxide layer over the well region;
   forming a gate stack over the interfacial oxide layer;
   forming a first raised source/drain region and a second raised source/drain region adjacent to opposite sides of the gate stack; and
   forming a first source/drain extension region that extends the first raised source/drain region to the well region and a second source/drain extension region that extends the second raised source/drain region to the well region.

2. The method of claim 1, wherein the wafer comprises either an ultra-thin silicon-on-insulator wafer or an extra-thin silicon-on-insulator wafer.

3. The method of claim 1, wherein both the first semiconductor layer and the second semiconductor layer comprise silicon.

4. The method of claim 1, further comprising the step of:
   implanting silicon into the buried oxide layer so as to render the entire buried oxide layer silicon-rich.

5. The method of claim 1, wherein the step of forming the well region further comprises the step of:
   introducing well implants into the first semiconductor layer.

6. The method of claim 1, wherein the step of forming a gate stack further comprises the steps of:
   depositing a high-K layer over the interfacial oxide layer; and
   depositing a metal gate layer over a side of the high-K layer opposite the interfacial oxide layer.

7. The method of claim 1, wherein the step of forming a gate stack further comprises the steps of:
   depositing a high-K layer over the interfacial oxide layer;
   depositing a metal gate layer over a side of the high-K layer opposite the interfacial oxide layer; and
   depositing a silicon layer over a side of the metal gate layer opposite the high-K layer.

8. The method of claim 1, further comprising the step of:
   forming a first halo region within the well region adjacent to the first source/drain extension region and a second halo region within the well region adjacent to the second source/drain extension region.

9. The method of claim 1, wherein the oxygen getterer species is implanted at a dose of between about $1 \times 10^{18}$ atoms per cubic centimeter and about $10 \times 10^{18}$ atoms per cubic centimeter.

10. The method of claim 1, wherein the oxygen getterer species comprise at least one of arsenic and boron.

11. The method of claim 7, wherein the silicon layer comprises one or more of amorphous silicon and polysilicon.

12. The method of claim 7, wherein the silicon layer has a thickness of between about 40 nanometers and about 90 nanometers.

13. The method of claim 7, wherein the silicon layer has a thickness of between about 50 nanometers and about 80 nanometers.

14. The method of claim 7, further comprising the step of:
   forming a silicide region on the silicon layer.

15. The method of claim 7, wherein the metal gate layer has a thickness of about 10 nanometers.

16. The method of claim 7, wherein the metal gate layer has a thickness of between about 20 nanometers and about 50 nanometers.

17. The method of claim 6, wherein the metal gate layer has a thickness of between about 50 nanometers and about 100 nanometers.

18. The method of claim 7, further comprising the step of:
   doping the silicon layer.

19. The method of claim 18, wherein the metal-oxide semiconductor device comprises an n-channel metal-oxide semiconductor field effect transistor device and wherein the silicon layer is doped with one or more of arsenic, phosphorous and antimony.

20. The method of claim 18, wherein the metal-oxide semiconductor device comprises a p-channel metal-oxide semiconductor field effect transistor device and wherein the silicon layer is doped with one or more of boron and borondifluoride.

* * * * *